(12) United States Patent
Luo

(10) Patent No.: US 11,171,306 B2
(45) Date of Patent: Nov. 9, 2021

(54) PACKAGE SUBSTRATE, MANUFACTURING METHOD THEREOF, OLED DISPLAY PANEL AND MANUFACTURING METHOD THEREOF

(71) Applicant: BOE TECHNOLOGY GROUP CO., LTD, Beijing (CN)

(72) Inventor: Chengyuan Luo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/974,903

(22) Filed: May 9, 2018

(65) Prior Publication Data
US 2019/0058153 A1     Feb. 21, 2019

(30) Foreign Application Priority Data
Aug. 16, 2017   (CN) .......................... 201710701692.6

(51) Int. Cl.
| H01L 51/52 | (2006.01) |
| H01L 27/32 | (2006.01) |
| H01L 51/56 | (2006.01) |
| H01L 51/00 | (2006.01) |

(52) U.S. Cl.
CPC ........ *H01L 51/5246* (2013.01); *H01L 27/322* (2013.01); *H01L 27/3246* (2013.01); *H01L 51/0024* (2013.01); *H01L 51/5203* (2013.01); *H01L 51/5228* (2013.01); *H01L 51/56* (2013.01); *H01L 51/524* (2013.01); *H01L 51/525* (2013.01); *H01L 2251/5315* (2013.01)

(58) Field of Classification Search
None
See application file for complete search history.

(56) References Cited

U.S. PATENT DOCUMENTS

| 2006/0035087 A1* | 2/2006 | Yadav ........................ C09J 9/02 428/411.1 |
| 2011/0218275 A1* | 9/2011 | Wu .......................... C08G 18/10 524/72 |
| 2014/0252317 A1* | 9/2014 | Gupta .................... H01L 51/525 257/40 |

(Continued)

FOREIGN PATENT DOCUMENTS

| CN | 102569669 A | 7/2012 |
| CN | 103545345 A | 1/2014 |

(Continued)

OTHER PUBLICATIONS

Chinese Office Action in Chinese Application No. 201710701692.6, dated Jul. 3, 2018 with English translation.

*Primary Examiner* — Zandra V Smith
*Assistant Examiner* — Lawrence C Tynes, Jr.
(74) *Attorney, Agent, or Firm* — Collard & Roe, P.C.

(57) ABSTRACT

A package substrate, a manufacturing method thereof, an organic light-emitting diode (OLED) display panel and a manufacturing method thereof are provided. The package substrate includes a transparent substrate; a plurality of spacers disposed on the transparent substrate; and auxiliary electrodes provided on the spacers and in a non-light-emitting region. Orthographic projections of the spacers on an array substrate fall within orthographic areas of a pixel define layer (PDL) on the array substrate.

14 Claims, 3 Drawing Sheets

(56) References Cited

U.S. PATENT DOCUMENTS

| | | | |
|---|---|---|---|
| 2014/0284590 A1* | 9/2014 | Nakazawa | G02B 5/223 257/40 |
| 2015/0004345 A1* | 1/2015 | Chaung | B32B 7/14 428/41.7 |
| 2015/0207098 A1* | 7/2015 | Yasuda | H01L 51/5092 257/40 |
| 2015/0340655 A1* | 11/2015 | Lee | H01L 51/525 257/40 |
| 2016/0035980 A1 | 2/2016 | Kong et al. | |
| 2016/0233458 A1 | 8/2016 | Shen et al. | |
| 2017/0125508 A1* | 5/2017 | Kim | H01L 51/5221 |

FOREIGN PATENT DOCUMENTS

| | | |
|---|---|---|
| CN | 104112767 A | 10/2014 |
| WO | 2015/100885 A1 | 7/2015 |

\* cited by examiner

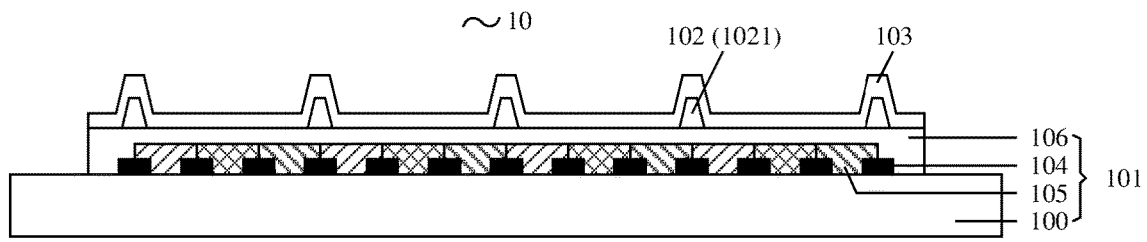
FIG. 1
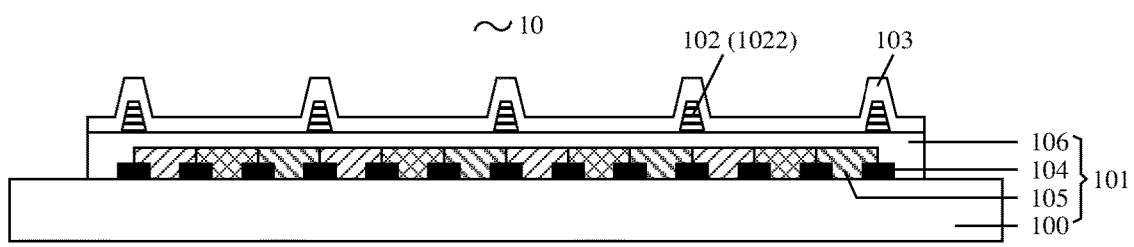
FIG. 2
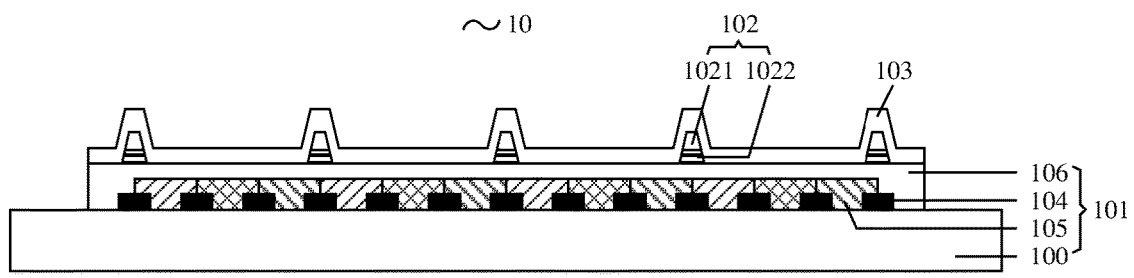
FIG. 3
forming a plurality of spacers on a transparent substrate, — S1
forming auxiliary electrodes in a non-light-emitting region on the spacers. — S2
FIG. 4

PACKAGE SUBSTRATE, MANUFACTURING METHOD THEREOF, OLED DISPLAY PANEL AND MANUFACTURING METHOD THEREOF

CROSS REFERENCE TO RELATED APPLICATIONS

The application claims priority to the Chinese patent application No. 201710701692.6, filed Aug. 16, 2017 on SIPO, titled "Package Substrate, Manufacturing Method thereof, OLED Display Panel and Manufacturing Method thereof", which is incorporated herein by reference in its entirety.

TECHNICAL FIELD

Embodiments of the present disclosure relate to a package substrate, a manufacturing method thereof, an organic light-emitting diode (OLED) display panel and a manufacturing method thereof.

BACKGROUND

OLED, taken as a current mode luminescent device, is widely applied in high-performance display field due to the advantages of autoluminescence, rapid response, high contrast, wide viewing angle, and capability of being manufactured on a flexible substrate. Top-emission type OLED device has become the main research direction of OLED devices due to the advantages of high aperture opening ratio and capability of utilizing microcavity effect to realize light extraction optimization.

SUMMARY

Embodiments of the present disclosure provide a package substrate, a manufacturing method thereof, an organic light-emitting diode (OLED) display panel and a manufacturing method thereof.

At least one embodiment of the present disclosure provides a package substrate, arranged oppositely to an array substrate, comprising: a transparent substrate; a plurality of spacers provided on the transparent substrate; and auxiliary electrodes provided on the spacers and in a non-light-emitting region. Orthographic projections of the plurality of spacers on the array substrate fall within orthographic areas of a pixel define layer (PDL) on the array substrate.

In an example of the present disclosure, the plurality of spacers are post spacers; or the plurality of spacers are conductive poles.

In an example of the present disclosure, the spacers include post spacers and conductive poles which are directly opposite to each other in position and overlap with each other.

In an example of the present disclosure, material of the auxiliary electrodes is any one selected from the group consisting of magnesium, silver, aluminum and indium tin oxide (ITO); and material of the conductive poles is any one selected from the group consisting of magnesium, silver and aluminum.

In an example of the present disclosure, the transparent substrate is a base substrate provided with black matrixes (BMs), a color filter (CF) layer and a planarization layer; the planarization layer covers a side of the BMs and the CF layer away from the base substrate; and orthographic projections of the spacers on the base substrate fall within orthographic projections of the BMs on the base substrate.

In an example of the present disclosure, the material of the auxiliary electrodes is any one selected from the group consisting of magnesium, silver, aluminum and ITO; and the material of the conductive poles is any one selected from the group consisting of magnesium, silver and aluminum.

In an example of the present disclosure, the transparent substrate is a base substrate provided with BMs, a CF layer and a planarization layer; the planarization layer covers a side of the BMs and the CF layer away from the base substrate; and orthographic projections of the spacers on the base substrate fall within orthographic projections of the BMs on the base substrate.

At least one embodiment of the present disclosure also provides a method for manufacturing the package substrate, wherein the package substrate and the array substrate are oppositely arranged; and the method comprises: forming a plurality of spacers on the transparent substrate; and forming the auxiliary electrodes in a non-light-emitting region on the spacers, wherein orthographic projections of the spacers on the array substrate fall within orthographic areas of the PDL on the array substrate.

In an example of the present disclosure: forming post spacers on the transparent substrate; or forming conductive poles on the transparent substrate.

In an example of the present disclosure, forming post spacers and conductive poles, which are directly opposite to and overlap with each other, on the transparent substrate.

In an example of the present disclosure, the material of the auxiliary electrodes is any one selected from the group consisting of magnesium, silver, aluminum and Indium Tin Oxide (ITO); and the material of the conductive poles is any one selected from the group consisting of magnesium, silver and aluminum.

In an example of the present disclosure, the transparent substrate is a base substrate provided with BMs, a CF layer and a planarization layer; the planarization layer covers a side of the BMs and the CF layer away from the base substrate; and orthographic projections of the spacers on the base substrate fall within orthographic areas of the BMs on the base substrate.

At least one embodiment of the present disclosure also provides an organic light-emitting diode (OLED) display panel, comprising the package substrate, an array substrate, and sealant and filling adhesive between the package substrate and the array substrate. Top electrodes of the array substrate contact the auxiliary electrodes of the package substrate; and the filling adhesive is filled into gaps between the package substrate and the array substrate.

In an example of the present disclosure, the filling adhesive includes first filling adhesive close to a side of the package substrate and second filling adhesive close to a side of the array substrate facing the side of the package substrate; the first filling adhesive includes thermal expansion materials; the second filling adhesive includes UV curing materials; and the first filling adhesive and the second filling adhesive have different viscosities.

At least one embodiment of the present disclosure also provides a method for manufacturing an OLED display panel, comprising: providing the package substrate according to claim 1 and an array substrate; applying sealant on the periphery of the package substrate, applying filling adhesive on regions, among the plurality of spacers in the sealant, on the auxiliary electrodes of the package substrate, and allowing the height of the filling adhesive to be less than the height of the sealant; pressing the package substrate and the array substrate, to allow top electrodes of the array substrate to contact the auxiliary electrodes of the package substrate; and heating the package substrate, to allow filling adhesive to fill into gaps between the package substrate and the array substrate.

In an example of the present disclosure, the heating of the package substrate to allow the filling adhesive to fill into the gaps between the package substrate and the array substrate comprises: heating the package substrate, allowing the first filling adhesive close to a side of the package substrate to be expanded, and pushing the second filling adhesive close to a side of the array substrate to fill the gaps between the package substrate and the array substrate.

BRIEF DESCRIPTION OF THE DRAWINGS

Embodiments of the present disclosure will be described in more detail below with reference to accompanying drawings to allow an ordinary skill in the art to more clearly understand embodiments of the present disclosure, in which:

FIG. 1 is a schematically structural view 1 of the package substrate provided by an exemplary embodiment of the present disclosure;

FIG. 2 is a schematically structural view 2 of the package substrate provided by an exemplary embodiment of the present disclosure;

FIG. 3 is a schematically structural view 3 of the package substrate provided by an exemplary embodiment of the present disclosure;

FIG. 4 is a flow chart of a manufacturing method of the package substrate provided by an exemplary embodiment of the present disclosure;

DETAILED DESCRIPTION

Figure 5:
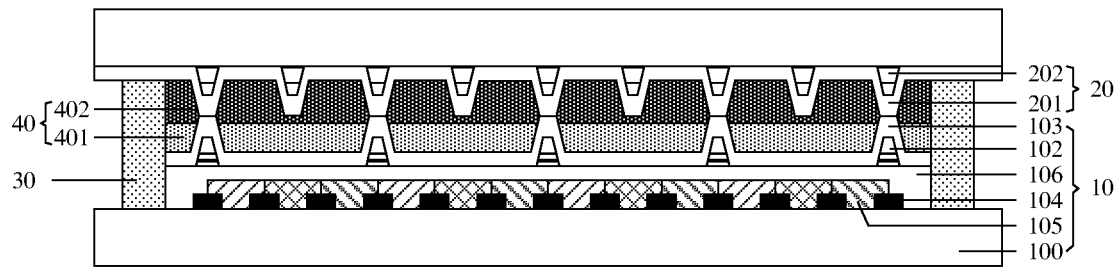
FIG. 5 is a schematically structural view of an OLED display panel provided by an exemplary embodiment of the present disclosure.

Hereinafter, technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, a person of ordinary skill in the art can obtain other embodiment(s), without any creative work, which shall be fall within the scope of the disclosure.

Unless otherwise defined, all the technical and scientific terms used herein have the same meanings as commonly understood by one of ordinary skill in the art to which the present disclosure belongs. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

In a top-emission OLED device, top electrodes disposed on the light-exiting side must have good light transmittance. The top electrodes in the top emission type OLED device adopt materials, such as thin metal, Indium Tin Oxide (ITO), and indium zinc oxide (IZO). The metal requires thinning treatment due to low transmittance, however, when the metal obtained after the thinning treatment is adopted as electrodes in large area, the resistance is significantly increased, so it is unfavorable in the development of large-size devices. Oxide materials with high transparency, such as ITO and IZO are prepared at low temperature, and the conductivity of the oxide materials is weaker than that of the metals, so the oxide materials cannot be independently used as electrodes.

In a case of adopting metal as auxiliary electrodes of ITO or IZO, photolithography technology is adopted to from the auxiliary electrodes on a non-light-emitting region of a backboard, so as to reduce the resistance and improve the conductivity of the electrodes. However, the photolithography technology requires complex processes, involves a plurality of mask and exposure processes, and requires high temperature and photoresist erosion process, and the like, the light-emitting layer of an OLED device will be damaged, so this technology is not applicable in a mass-production. Another way is to prepare the auxiliary electrodes on a package cover to improve the conductivity of the electrodes. This way can avoid the problems in the above preparation process. However, as packaging adhesive covers the auxiliary electrodes of the package cover, it is difficult for the auxiliary electrodes run through the adhesive material and contact the top electrodes of the OLED in the pressing process, so the expected effect cannot be obtained.

More comprehensive description will be given below to the exemplary embodiments of the present disclosure with reference to the accompanying drawings. However, the exemplary embodiments of the present disclosure can be implemented in various forms and shall not be construed as being limited to the examples described herein. These embodiments are provided so that the present disclosure will be more comprehensive and complete, and the concept of the exemplary embodiments is more comprehensively conveyed to a person of skill in the art. The described features, structures or characteristics may be combined in one or more embodiments in any suitable manner. In the following description, numerous details are provided to facilitate the understanding to the embodiments of the present disclosure. However, a person of ordinary skill in the art should appreciate that the technical proposals of the present disclosure may be implemented with one or more of the specific details omitted, or other ways, components, devices, operations and the like may be used. For the purpose of clarity, commonly known technical proposals are not shown or described in detail to avoid obscuring aspects of the embodiments of the present disclosure.

In addition, the accompanying drawings are only the schematic diagrams of the embodiments of the present disclosure and not necessarily drawn in proportion. The thickness and the shape of the layers in the accompanying drawings do not reflect the true scale but are only intended to illustrate the embodiments of the present disclosure.

An exemplary embodiment of the present disclosure provides a package substrate 10, which is arranged oppositely to an array substrate and used for forming a top-emission type OLED display panel. As illustrated in FIGS. 1-3, the package substrate 10 may comprise: a transparent substrate 101; a plurality of spacers 102 disposed on the transparent substrate 101; and auxiliary electrodes 103 disposed on the spacers 102 and in a non-light-emitting region. Orthographic projections of the spacers 102 on the array substrate fall within orthographic areas of a pixel definition layer (PDL) of the array substrate.

It should be noted that the non-light-emitting region refers to areas except subpixel areas, and the areas correspond to the areas of the PDL in the array substrate.

For instance, both the position of the spacers 102 and the position of the auxiliary electrodes 103 in the embodiment correspond to the position of the PDL in the array substrate, and only correspond to partial regions of the PDL. The coverage area of the spacers 102 is small, and the coverage area of the auxiliary electrodes 103 is large.

In the package substrate 10 provided by the exemplary embodiments of the present disclosure, the plurality of spacers 102 are disposed between the transparent substrate 101 and the auxiliary electrodes 103. The plurality of spacers 102 may provide a stepped structure for the auxiliary electrodes 103, so that the auxiliary electrodes 103 can be protruded at positions corresponding to the spacers 102, to allow full contact between the auxiliary electrodes 103 of the package substrate 10 and the top electrodes of the array substrate in the subsequent pressing process, and the resistance of the top electrodes is decreased and the conductivity of the top electrodes is improved.

Based on the above structure, the material of the auxiliary electrodes 103 may be any one selected from the group consisting of magnesium, silver, aluminum, and ITO. The auxiliary electrodes 103 may contact the top electrodes of the array substrate to reduce the resistance of the top electrodes.

In the example, as shown in FIGS. 1-3, the transparent substrate 101 may be a base substrate 100 provided with BMs 104, a CF layer 105 and a planarization layer 106, and the planarization layer 106 covers a side of the BMs 104 and the CF layer 105 away from the base substrate 100.

Orthographic projections of the spacers 102 on the base substrate 100 fall within orthographic areas of the BMs 104 on the base substrate 100. That is to say, in the direction perpendicular to the base substrate 100, the projections of the BMs 104 may completely cover the projections of the spacers 102, and the projection area of the BMs 104 is generally greater than that of the spacers 102.

It should be noted that the relative position of the BMs 104 and the CF layer 105 may be varied in the embodiments. For instance, the BMs 104 may be on the lower part (namely close to the base substrate 100) and the CF layer 105 may be on the upper part (namely close to the planarization layer 106), or the CF layer 105 may be on the lower part (namely close to the base substrate 100) and the BMs 104 may be on the upper part (namely close to the planarization layer 106).

In addition, for instance, the planarization layer 106 may be formed on the base substrate 100 by spin coating via elastic resin materials, such as phenolic resin, polypropylene resin, polyimide resin and acrylic resin, and covers the BMs 104 and the CF layer 105, and the thickness of the planarization layer is about 1-2 μm. However, the embodiments of the present disclosure are not limited thereto.

The transparent substrate 101 in the embodiment may also include other layer structures in addition to the BMs 104, the CF layer 105 and the planarization layer 106. Moreover, the transparent substrate 101 in the embodiment may also be only a base substrate 100, e.g., a glass substrate, or a flexible substrate.

Optionally, as shown in FIG. 1, the spacers 102 may be post spacers (PS) 1021; or as shown in FIG. 2, the spacers 102 may be conductive poles 1022; or as shown in FIG. 3, the spacers 102 may simultaneously include post spacers 1021 and conductive poles 1022 which are directly opposite to each other in position and overlap with each other, and the relative position of the post spacers 1021 and the conductive poles 1022 may be exchanged.

The post spacers 1021 may be prepared by common photoresist via processes, such as exposure, development and baking. The conductive poles 1022 may be prepared by any one of the conductive materials, such as magnesium, silver, and aluminum.

For instance, the spacers 102 may be correspondingly disposed in the non-light-emitting region of the package substrate 10, so as to form a large-area reticular-like structure or columnar-like structure with a height of about 5-10 μm and a diameter of about 15-20 μm.

It should be noted that one or more subpixels may be arranged between adjacent spacers 102.

In an instance that the spacers 102 include the conductive poles 1022, the conductive poles 1022 shall contact the auxiliary electrodes 103 to maintain the electrical connection, so as to further reduce the resistance of the auxiliary electrodes 103 and improve the conductivity of the auxiliary electrodes.

As the spacers 102 may provide a stepped structure for the auxiliary electrodes 103, the spacers may adopt conductive materials or non-conductive materials. However, to further improve the conductivity of the auxiliary electrodes 103, the embodiment may also adopt the spacers 102 made from conductive materials, for instance, adopt the conductive poles directly, or adopt a multi-layer structure formed by the post spacers and the conductive poles together.

For example, as shown in FIG. 3, the package substrate 10 in the embodiment of the present disclosure may comprise a base substrate 100, BMs 104 disposed on the base substrate 100, a CF layer 105 disposed at gaps on the BMs 104, a planarization layer 106 disposed on the BMs 104 and the CF layer 105, conductive poles 1022 disposed on the planarization layer 106, post spacers 1021 disposed directly above the conductive poles 1022, and auxiliary electrodes 103 disposed on the post spacers 1021. For instance, the height of the conductive poles 1022 is about 100-300 nm. For instance, the conductive poles may be silver conductive poles with a height of 300 nm. The height of the post spacers 1021 is about 5-10 μm. For instance, the post spacers may be PS photoresist with a height of 5 μm. The auxiliary electrodes 103, for instance, may be ITO electrodes with a height about 100 nm. The conductive poles 1022 and the post spacers 1021 together form spacers 102. Both the spacers 102 and the auxiliary electrodes 103 correspond to areas of a PDL in the array substrate, and the auxiliary electrodes 103 also contact the conductive poles 1022.

In this way, the auxiliary electrodes 103 will be protruded at positions corresponding to the spacers 102, thus realizing the full contact between the auxiliary electrodes 103 of the package substrate 10 and the top electrodes of the array substrate in the subsequent pressing process, and improving the conductivity of the top electrodes.

An exemplary embodiment of the present disclosure also provides a method of manufacturing a package substrate. A package substrate 10 and an array substrate are oppositely arranged and used for forming a top-emission type OLED display panel. As illustrated in FIG. 4, the method for manufacturing the package substrate may comprise following operations.

S1: forming a plurality of spacers 102 on a transparent substrate 101; and

S2: forming auxiliary electrodes 103 in a non-light-emitting region on the spacers 102;

Orthographic projections of the spacers 102 on the array substrate fall within orthographic areas of a PDL in the array substrate.

It should be noted that the non-light-emitting region refers to areas except subpixel areas, and the areas correspond to the areas of the PDL in the array substrate.

Detailed description will be given below to the method for manufacturing the package substrate with reference to the accompanying drawings.

In the step S1, the plurality of spacers 102 are formed on the transparent substrate 101.

As shown in FIGS. 1-3, the step S1 may include the following examples:

forming a plurality of post spacers 1021 on the transparent substrate 101; or forming a plurality of conductive poles 1022 on the transparent substrate 101; or forming a plurality of post spacers 1021 on the transparent substrate 101, and forming a plurality of conductive poles 1022 directly above the post spacers 1021; or forming a plurality of conductive poles 1022 on the transparent substrate 101, and forming a plurality of post spacers 1021 directly above the conductive poles 1022.

For instance, the post spacers 1021 may be prepared by general photoresist materials via processes, such as exposure, development and baking, and the conductive poles 1022 may be prepared by any one of conductive materials, such as magnesium, silver and aluminum.

In the above embodiments, the spacers 102 may be correspondingly disposed in the non-light-emitting region of the package substrate 10, so as to form a large-area reticular-like structure or columnar-like structure with a height of about 5-10 μm and a diameter of about 15-20 μm.

It should be noted that one or more subpixels are arranged between adjacent spacers 102.

In the step, the transparent substrate 101 may be a base substrate 100, e.g., a glass substrate or a flexible substrate; or the transparent substrate 101 may also be a base substrate 100 provided with BMs 104, a CF layer 105 and a planarization layer 106. For instance, the transparent substrate 101 may also comprise other layer structures in addition to the BMs 104, the CF layer 105 and the planarization layer 106.

For the instance that the transparent substrate 101 includes the base substrate 100, the BMs 104, the CF layer 105 and the planarization layer 106, the method for manufacturing the transparent substrate 101 may comprise following operations.

forming the BMs 104 and the CF layer 105 on the base substrate 100; and forming the planarization layer 106 on the BMs 104 and the CF layer 105.

In an embodiment, the above step, for instance, may include: firstly, forming the BMs 104 on the base substrate 100 by exposure, development, and the like; secondly, forming the CF layer 105 at gaps on the BMs 104 via exposure, development and the like; then, forming the planarization layer 106 on the BMs 104 and the CF layer 105 by exposure, development, etching, and the like.

In another embodiment, the above step, for instance, may include: firstly, forming the CF layer 105 on the base substrate 100 by exposure, development, and the like; secondly, forming the BMs 104 at gaps on the CF layer 105 via exposure, development and the like; then, forming the planarization layer 106 on the BMs 104 and the CF layer 105 by exposure, development, etching, and the like.

It should be noted that in a case that the transparent substrate 101 comprises the BMs 104, orthographic projections of the spacers 102 on the base substrate 100 fall within orthographic areas of the BMs 104 on the base substrate 100, namely the BMs 104 can completely shield the spacers 102.

In the step S2, the auxiliary electrodes 103 are formed in the non-light-emitting region on the spacers 102.

In a case that the spacers 102 include the conductive poles 1022, the auxiliary electrodes 103 contact the conductive poles 1022, so as to reduce the resistance of the auxiliary electrodes 103 and improve the conductivity of the auxiliary electrodes 103.

In the step, the material of the auxiliary electrodes 103 may be any one selected from the group consisting of magnesium, silver, aluminum and ITO, but the embodiment of the present disclosure is not limited thereto. The method for preparing the auxiliary electrodes 103, for instance, may include: firstly, forming a conductive layer with a thickness of about 10-100 nm on the spacers 102 by a physical vapor deposition (PVD) process, or an evaporation process; secondly, performing processes, such as exposure, development and etching on the conductive layer via a mask and obtaining a required pattern of the auxiliary electrodes 103.

The exemplary embodiment also provides an OLED display panel. As illustrated in FIG. 5, the display panel comprises the foregoing package substrate 10, an array substrate 20, and sealant 30 and filling adhesive 40 disposed between the package substrate and the array substrate.

Top electrodes 201 of the array substrate 20 contact the auxiliary electrodes 103 of the package substrate 10. The sealant 30 is disposed in a peripheral region, namely the non-display region, of the package substrate 10. The filling adhesive 40 is filled into gaps between the package substrate 10 and the array substrate 20.

It should be noted that the filling adhesive 40 adopted in the embodiment has thermal expansibility, will fill the gaps between the package substrate 10 and the array substrate 20 after being heated, and is not subjected to thermal expansion before being heated, so the thickness of the filling adhesive is designed to be less than the thickness of the sealant 30.

As the top electrodes 201 of the array substrate 20 and the auxiliary electrodes 103 of the package substrate 10 have full contact each other before the filling adhesive 40 being heated, the case of insufficient contact between the top electrodes 201 and the auxiliary electrodes 103 introduced by the filing adhesive 40 can be effectively avoided. In addition, the height of the auxiliary electrodes 103 of the package substrate 10 at positions corresponding to the spacers 102 is large; the height of the top electrodes 201 of the array substrate 20 at positions corresponding to the PDL 202 is large; and the positions of the spacers 102 also correspond to the PDL 202, so the auxiliary electrodes 103 and the top electrodes 201 can contact each other more easily in the substrate pressing process.

In the exemplary embodiment of the present disclosure, the filling adhesive 40 may include first filling adhesive 401 close to a side of the package substrate 10 and second filling adhesive 402 close to a side of the array substrate 20 facing the side of the package substrate 10.

The first filling adhesive 401 may include thermal expansion material; the second filling adhesive 402 may include UV curing material; and the first filling adhesive 401 and the second filling adhesive 402 have different viscosities.

In this way, as the first filling adhesive 401 and the second filling adhesive 402 have different viscosities, the filling adhesive mixing phenomenon in the pressing process can be effectively reduced; and as the second filling adhesive 402 covers the surface of the first filling adhesive 401, the pollution, caused by an expansion agent in the first filling adhesive 401 contacts the OLED device, can be avoided.

Optionally, the composition of the first filling adhesive 401 may include a mixture of thermal expansion agent and resin material, and the volume ratio of the thermal expansion agent to the resin material is less than 1:2. The thermal expansion agent may be expanded under the condition of about 25-100□, which may be a transparent material. For instance, it may include a mixture formed by alkali silicate and polylol, an oxide-molybdenum gradient material, and the like. The resin may be cured under the condition of UV irradiation. For instance, the resin may include homopolymer or copolymer of monomers, such as epoxy resin, glycidyl acrylate, glycidyl methacrylate (GMA), methyl methacrylate (MMA), ethyl methacrylate, n-butyl methacrylate, methyl polyacrylic acid 6,7 heptane, and 2-hydroxyethyl methacrylate; melamine resin, unsaturated polyester resin, silicone resin, furan resin, or the like. The viscosity of the first filling adhesive 401 may be about 500-2,000 mPa·s. The first filling adhesive may be filled into regions encircled by the spacers 102 of the package substrate 10 by printing, and the filling height is about 1-5 μm.

Optionally, the composition of the second filling adhesive 402 may include UV curing resin materials, such as homopolymer or copolymer of monomers, such as epoxy resin, glycidyl acrylate, glycidyl methacrylate (GMA), methyl methacrylate (MMA), ethyl methacrylate, n-butyl methacrylate, methyl polyacrylic acid 6,7 heptane, and 2-hydroxyethyl methacrylate; melamine resin, unsaturated polyester resin, silicone resin, furan resin, or the like. The viscosity of the second filling adhesive 402 may be about 10-100 mPa·s. The second filling adhesive 402 may be filled into the regions encircled by the spacers 102 of the package substrate 10 by printing and cover the first filling adhesive 401, and the filling height is about 1-5 μm.

Optionally, the composition of the sealant 30 may include UV curing resin materials, such as homopolymer or copolymer of monomers, such as epoxy resin, glycidyl acrylate, glycidyl methacrylate (GMA), methyl methacrylate (MMA), ethyl methacrylate, n-butyl methacrylate, methyl polyacrylic acid 6,7 heptane, and 2-hydroxyethyl methacrylate; melamine resin, unsaturated polyester resin, silicone resin, furan resin, or the like. The viscosity of the sealant 30 is about 10,000-400,000 mPa·s, and the thickness after curing is about 10-25 μm.

Figure 6:
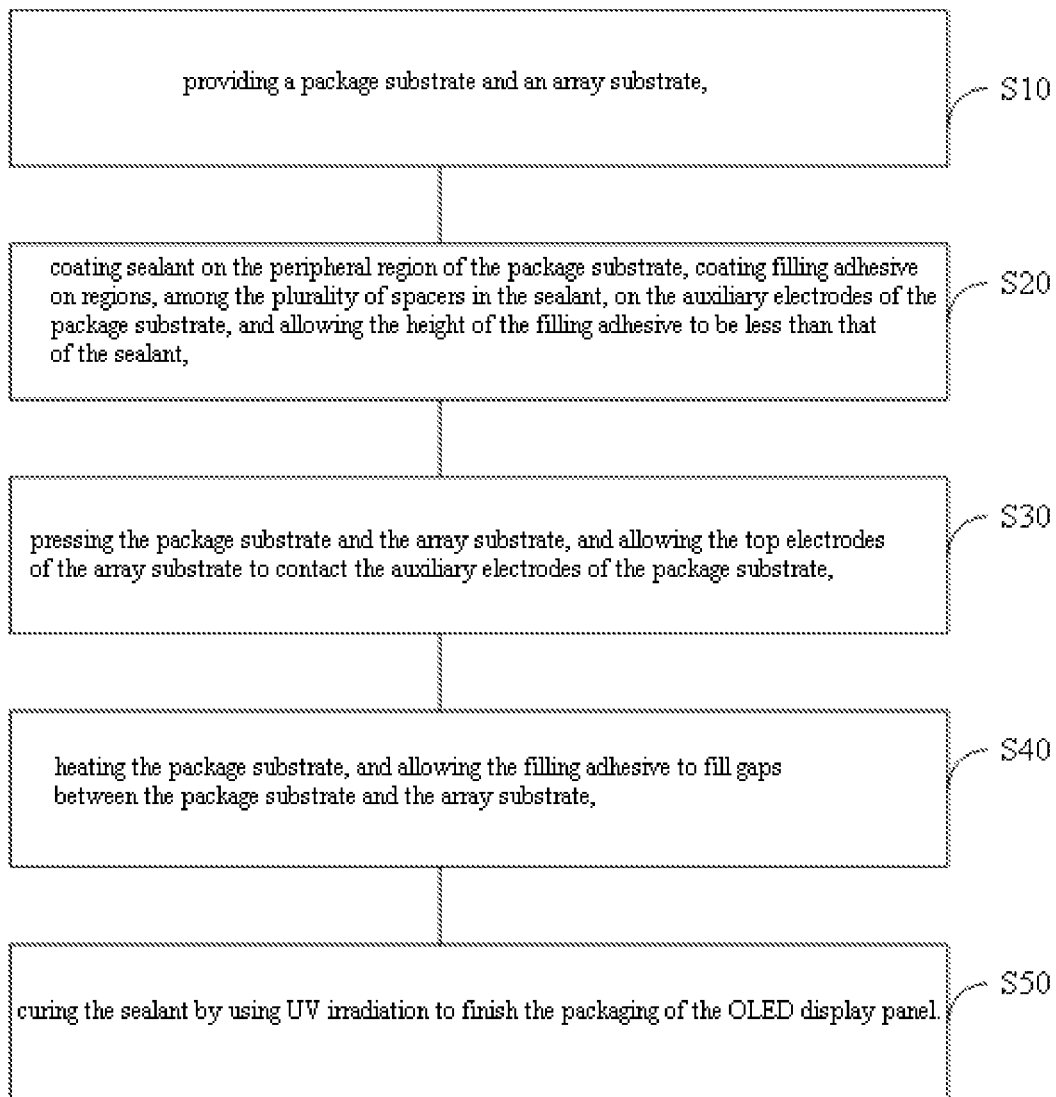
FIG. 6 is a flow chart of a manufacturing method of the OLED display panel provided by an exemplary embodiment of the present disclosure.

The embodiments of the present disclosure also provide a method for manufacturing an OLED display panel. As illustrated in FIG. 6, the manufacturing method comprises following operations.

Figure 7:
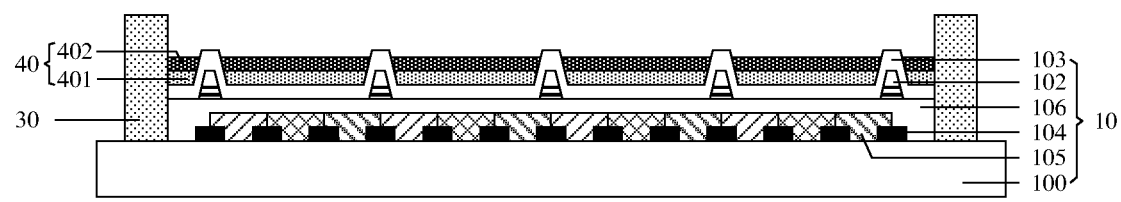
FIGS. 7 and 8 are schematically diagrams illustrating the manufacturing processes of the OLED display panel provided by exemplary embodiments of the present disclosure.
Figure 8:
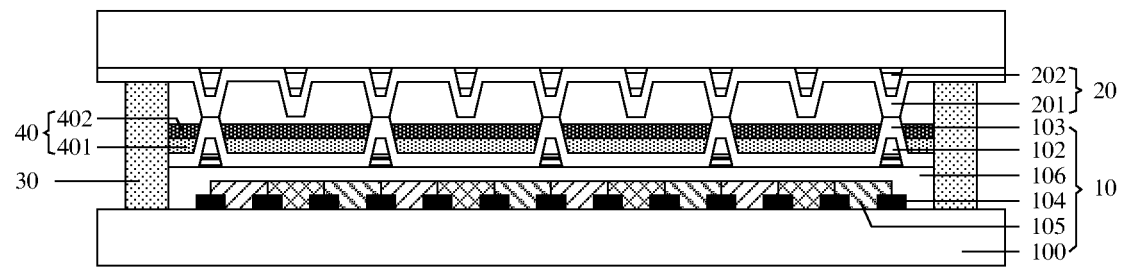

S10: providing a package substrate 10 and an array substrate 20;

S20: as shown in FIG. 7, coating sealant 30 on a peripheral region of the package substrate 10, coating filling adhesive 40 on regions, among the plurality of spacers 102 in the sealant 30, on the auxiliary electrodes 103 of the package substrate 10, and allowing the filling adhesive 40 has a height to be less than that of the sealant 30;

S30: as shown in FIG. 8, pressing the package substrate 10 and the array substrate 20, and allowing the top electrodes 201 of the array substrate to contact the auxiliary electrodes 103 of the package substrate 10; and S40: as shown in FIG. 5, heating the package substrate 10, and allowing the filling adhesive 40 to fill gaps between the package substrate 10 and the array substrate 20.

The filling adhesive 40 may include first filling adhesive 401 close to a side of the package substrate 10 and second filling adhesive 402 close to a side of the array substrate 20 facing the side of the package substrate 10. The first filling adhesive 401 may include thermal expansion materials; the second filling adhesive 402 may include UV curing materials; and the first filling adhesive 401 and the second filling adhesive 402 have different viscosities.

The step S40, for instance, may include: heating the package substrate 10, allowing the first filling adhesive 402 close to the side of the package substrate 10 to be expanded, and pushing the second filling adhesive 402 close to the side of the array substrate 20 to fill all the gaps between the package substrate 10 and the array substrate 20.

For instance, as shown in FIG. 6, the method for manufacturing the OLED display panel may also comprise:

S50: curing the sealant 30 by UV irradiation to finish the packaging of the OLED display panel.

For instance, the method for manufacturing the OLED display panel in the embodiment may comprise the following operations: coating sealant 30 on a peripheral region of the package substrate 10; printing about 2 μm composite materials of zirconia-molybdenum gradient materials and epoxy resins (namely the first filling adhesive 401) and about 2 μm second filling adhesive 402 in sequence on the regions among the spacers 102, on the auxiliary electrodes 103; and allowing the overall height of the first filling adhesive 401 and the second filling adhesive 402 not to exceed the height of the sealant 30; pressing the package substrate 10 and the array substrate 20, and allowing the auxiliary electrodes 103 of the package substrate 10 to contact the top electrodes 201 of the array substrate 20; heating the package substrate 10, allowing the first filling adhesive 401 to be expanded, and pushing the second filling adhesive 402 to fill the inner space between the two substrates; and curing the sealant 30 by UV irradiation, and finishing the packaging of the OLED display panel.

In the OLED display panel provided by the exemplary embodiment of the present disclosure, the filling adhesive 40 may expose the auxiliary electrodes 103 of the package substrate 10, so that the auxiliary electrodes 103 of the package substrate 10 can contact the top electrodes 201 of the array substrate 20 at first in the process of pressing the package substrate 10 and the array substrate 20; subsequently, the first filling adhesive 401 is controlled to be heated and expanded to push the second filling adhesive 402 with low viscosity to diffuse, so that the adhesive fills the entire gap space between the package substrate 10 and the array substrate 20; then, the sealant 30 and the filling adhesive 40 are subjected to UV curing, to allow full contact between the auxiliary electrodes 103 and the top electrodes 201 and the sufficient filling of the adhesive.

It should be noted that the details of the method for manufacturing the OLED display panel have been described in corresponding OLED display panel, so no further description will be repeated herein.

The exemplary embodiments of the present disclosure also provide an OLED display device, which comprises the foregoing OLED display panel. In the OLED display device, the auxiliary electrodes 103 of the package substrate 10 and the top electrodes 201 of the array substrate 20 can maintain good contact, so as to reduce the resistance of the top electrodes 201 and improve the conductivity of the top electrodes.

In the exemplary embodiments of the present disclosure, the OLED display device, for instance, may comprise any product or component with display function, such as a mobile phone, a tablet PC, a TV, a notebook computer, a digital picture frame and a navigator, but the embodiments of the present disclosure are not limited thereto.

The foregoing is only the exemplary embodiments of the present disclosure, but the scope of the present disclosure is not limited thereto. A person of ordinary skill in the art can make various changes and modifications without departing from the spirit of the present disclosure, and such changes and modifications shall fall into the scope of the present disclosure.

What is claimed is:

1. An organic light-emitting diode (OLED) display panel, comprising a package substrate, an array substrate arranged oppositely to the package substrate, sealant, and filling adhesives between the package substrate and the array substrate,
    wherein the package substrate comprises:
        a transparent substrate;
        a plurality of spacers provided on the transparent substrate; and
        auxiliary electrodes provided on the spacers and in a non-light-emitting region;
        wherein the plurality of spacers have orthographic projections on the array substrate falling within orthographic areas of a pixel definition layer (PDL) on the array substrate;
    wherein the array substrate includes top electrodes in a wave shape as a whole and directly contact the auxiliary electrodes of the package substrate, an orthographic projection of each protruded portion of each of the top electrodes on the array substrate cover an orthographic projection of a corresponding pattern of pixel definition layer on the array substrate; and the filling adhesives are filled into gaps between the package substrate and the array substrate to form adhesive layers;
    wherein the adhesive layers include a first adhesive layer close to a side of the package substrate, and a second adhesive layer close to a side of the array substrate facing the side of the package substrate, the second adhesive layer provided on the first adhesive layer; and
    the first adhesive layer comprises a first filling adhesive, a composition of the first filling adhesive including a mixture of thermal expansion agent and resin material, and the volume ratio of the thermal expansion agent to the resin material is less than 1:2, and the second adhesive layer comprises a second filling adhesive comprising UV curing material, both of the first filling adhesive and the second filling adhesive being organic adhesives, and viscosity of the first filling adhesive is larger than viscosity of the second filling adhesive, and an overall height of the first filling adhesive and the second filling adhesive does not exceed a height of the sealant, such that when the package substrate is heated, the first filling adhesive is expanded and push the second filling adhesive with low viscosity to diffuse to fill an entire gap space between the package substrate and the array substrate.

2. The OLED display panel according to claim 1, wherein the spacers include post spacers and conductive poles which are directly opposite to each other in position and overlap with each other.

3. The OLED display panel according to claim 1, wherein material of the auxiliary electrodes is any one selected from the group consisting of magnesium, silver, aluminum and indium tin oxide (ITO); and material of the conductive poles is any one selected from the group consisting of magnesium, silver and aluminum.

4. The OLED display panel according to claim 1, wherein the transparent substrate is a base substrate provided with black matrixes (BMs), a color filter (CF) layer and a planarization layer;
    the planarization layer covers a side of the BMs and the CF layer away from the base substrate; and
    orthographic projections of the spacers on the base substrate fall within orthographic projections of the BMs on the base substrate.

5. The OLED display panel according to claim 4, wherein an orthographic projection of the color filter layer on the base substrate respectively covers a part of an orthographic projection of each of two adjacent black matrices on the base substrate.

6. The package substrate according to claim 1, wherein the material of the auxiliary electrodes is any one selected from the group consisting of magnesium, silver, aluminum and ITO; and the material of the conductive poles is any one selected from the group consisting of magnesium, silver and aluminum.

7. The package substrate according to claim 1, wherein the transparent substrate is a base substrate provided with BMs, a CF layer and a planarization layer;
    the planarization layer covers a side of the BMs and the CF layer away from the base substrate; and
    orthographic projections of the spacers on the base substrate fall within orthographic projections of the BMs on the base substrate.

8. The OLED display panel according to claim 1, wherein an orthographic projection of a surface of the pattern part of the pixel definition layer away from the array substrate is in an orthographic projection of another surface of the pattern part of the pixel definition layer near the array substrate.

9. A method for manufacturing an OLED display panel, comprising:
    providing a package substrate, wherein the package substrate comprises: a transparent substrate; a plurality of spacers provided on the transparent substrate; and auxiliary electrodes provided on the spacers and in a non-light-emitting region; and the plurality of spacers have orthographic projections on the transparent substrate falling within orthographic areas of a pixel definition layer (PDL) on the transparent substrate;
    providing an array substrate;
    applying sealant on the periphery of the package substrate;
    applying a first filling adhesive and a second filling adhesive sequentially among the plurality of spacers in an area surrounded by the sealant, on the auxiliary electrodes of the package substrate, to form adhesive layers;
    allowing the filling adhesives to have a height less than a height of the sealant;
    pressing the package substrate and the array substrate, to allow top electrodes of the array substrate to directly contact the auxiliary electrodes of the package substrate, the top electrodes of the array substrate are in a wave shape as a whole, an orthographic projection of each protruded portion of each of the top electrodes on the array substrate to cover an orthographic projection of a corresponding pattern part of the pixel definition layer on the array substrate; and
    heating the package substrate, to allow the filling adhesives to fill into gaps between the package substrate and the array substrate to form adhesive layers;
    wherein the adhesive layers includes a first adhesive layer close to a side of the package substrate and a second adhesive layer close to a side of the array substrate facing the side of the package substrate, the second adhesive layer being provided on the first adhesive layer;

wherein the first filling adhesive including thermal expansion material, a composition of the first filling adhesive including a mixture of thermal expansion agent and resin material, and the volume ratio of the thermal expansion agent to the resin material is less than 1:2; and the second filling adhesive including UV curing material, both of the first adhesive layer and the second adhesive layer are formed by organic adhesives, and the viscosity of the first filling adhesive is larger than the viscosity of the second filling adhesive, and an overall height of the first filling adhesive and the second filling adhesive does not exceed a height of the sealant, and wherein the heating of the package substrate to allow the filling adhesives to fill into the gaps between the package substrate and the array substrate comprises:

heating the package substrate, allowing the first filling adhesive close to a side of the package substrate to be expanded and to push the second filling adhesive with low viscosity close to a side of the array substrate to diffuse to fill an entire gap space between the package substrate and the array substrate.

10. The method according to claim 9, further comprising: forming post spacers and conductive poles, which are directly opposite to and overlap with each other, on the transparent substrate.

11. The method according to claim 9, wherein the material of the auxiliary electrodes is any one selected from the group consisting of magnesium, silver, aluminum and Indium Tin Oxide (ITO); and the material of the conductive poles is any one selected from the group consisting of magnesium, silver and aluminum.

12. The method according to claim 9, wherein the transparent substrate is a base substrate provided with BMs, a CF layer and a planarization layer;

the planarization layer covers a side of the BMs and the CF layer away from the base substrate; and orthographic projections of the spacers on the base substrate fall within orthographic areas of the BMs on the base substrate.

13. The OLED display panel according to claim 12, wherein an orthographic projection of the color filter layer on the base substrate respectively covers a part of an orthographic projection of each of two adjacent black matrices on the base substrate.

14. The OLED display panel according to claim 9, wherein an orthographic projection of a surface of the pattern part of the pixel definition layer away from the array substrate is in an orthographic projection of another surface of the pattern part of the pixel definition layer near the array substrate.

* * * * *

UNITED STATES PATENT AND TRADEMARK OFFICE
CERTIFICATE OF CORRECTION

| | |
|---|---|
| PATENT NO. | : 11,171,306 B2 |
| APPLICATION NO. | : 15/974903 |
| DATED | : November 9, 2021 |
| INVENTOR(S) | : Chengyuan Luo |

It is certified that error appears in the above-identified patent and that said Letters Patent is hereby corrected as shown below:

On the Title Page

Column 1, item (71), please change:
"BOE TECHNOLOGY GROUP CO., LTD, Beijing (CN)"
To correctly read:
--BOE TECHNOLOGY GROUP CO., LTD., Beijing (CN)--

Signed and Sealed this
Twenty-third Day of August, 2022

Katherine Kelly Vidal
*Director of the United States Patent and Trademark Office*